United States Patent [19]

Mukai

[11] Patent Number: 5,264,072
[45] Date of Patent: Nov. 23, 1993

[54] METHOD FOR RECRYSTALLIZING CONDUCTIVE FILMS BY AN INDIRECT-HEATING WITH A THERMAL-CONDUCTION-CONTROLLING LAYER

[75] Inventor: Ryoichi Mukai, Kawasaki, Japan
[73] Assignee: Fujitsu Limited, Kawasaki, Japan
[21] Appl. No.: 610,452
[22] Filed: Nov. 9, 1990

Related U.S. Application Data

[63] Continuation of Ser. No. 203,633, Jun. 6, 1988, abandoned, which is a continuation of Ser. No. 937,412, Dec. 3, 1986, abandoned.

[30] Foreign Application Priority Data

Dec. 4, 1985 [JP] Japan ................................ 60-272677

[51] Int. Cl.⁵ .............................................. C30B 13/00
[52] U.S. Cl. .............................. 156/620.7; 156/620.72
[58] Field of Search ............ 156/603, DIG. 76, 616.2, 156/620.71, 620.72; 148/DIG. 15, DIG. 90, DIG. 118, DIG. 134; 437/943, 238, 83

[56] References Cited

U.S. PATENT DOCUMENTS

| | | | |
|---|---|---|---|
| 3,655,439 | 4/1972 | Seiter | 156/603 |
| 4,388,145 | 6/1983 | Hawkins et al. | 156/617 R |
| 4,448,632 | 5/1984 | Akasaka | 156/603 |
| 4,543,133 | 9/1985 | Mukai | 148/175 |
| 4,545,823 | 10/1985 | Drowley | 148/176 |
| 4,589,951 | 5/1986 | Kawamura | 156/617 R |

FOREIGN PATENT DOCUMENTS

| | | | |
|---|---|---|---|
| 0071471 | 2/1983 | European Pat. Off. | |
| 0127323 | 12/1984 | European Pat. Off. | |
| 0140812 | 7/1985 | Japan | 148/DIG. 90 |
| 0231319 | 11/1985 | Japan | 148/DIG. 90 |
| 0254723 | 12/1985 | Japan | 148/DIG. 90 |

OTHER PUBLICATIONS

Mukai et al., "Single Crystalline Si Islands . . . ", Appl. Phys. Lett. 44(10) 15 May 1984.
Sakurai et al., "Laser-Induced Lateral Epitaxial Growth Over Silicon Dioxide with Locally Varied Encapsulation", Appl. Phys. Lett. 41(1) 1982, pp. 64–67.
Journal of Applied Physics, vol. 55, No. 6, Mar. 15, 1984, pp. 1607–1609, American Institute of Physics, NY; S. Kawamura et al.: "Laser Recrystallization of Si over SiO2 with a Heat-Sink Structure".
Extended Abstracts, vol. 82-1, May 1982, pp. 243–244, Abstract No. 150, Pennington, N.J.; S. Kawamura et al.: "Laser-Induced Lateral Epitaxial Growth of Si over SiO2".
IBM Technical Disclosure Bulletin, vol. 22, No. 12, May 1980, pp. 5473, 5474, New York; A. B. Fowler et al.: "Selective Laser Annealing Through Quarter- and Half-Wave Coatings".
European Search Report, The Hague, Oct. 19, 1988.

Primary Examiner—R. Bruce Breneman
Attorney, Agent, or Firm—Staas & Halsey

[57] ABSTRACT

A process allowing so-called indirect-heating SOI methodology to selectively transform predefined regions of a semiconductor film formed on an insulating substrate into grain-boundary-free regions. In an indirect-heating SOI, a semiconductor film which is recrystallized to be grain-boundary free is heated above its melting point by the heat generated in an energy-absorbing layer formed thereon. In the present invention, a layer having a relatively smaller thermal conductivity, such as $SiO_2$ layer, is provided between the semiconductor film to be recrystallized and the energy-absorbing layer, both having larger thermal conductivities. The smaller-thermal-conductivity layer, functioning as a thermal-resistance, has selectively increased thickness at the portions thereof corresponding to the predefined regions transformed to be grain-boundary free in the semiconductor film. In each of the predefined regions, a desired temperature distribution profile, that is, the lowest at the center of the region and becoming higher toward the periphery of the region, is established, when the energy-absorbing layer is irradiated with a beam of radiant energy sufficient to melt the semiconductor film. Thus, the semiconductor film can be recrystallized to be grain-boundary-free single crystalline in each predefined region.

5 Claims, 3 Drawing Sheets

METHOD FOR RECRYSTALLIZING CONDUCTIVE FILMS BY AN INDIRECT-HEATING WITH A THERMAL-CONDUCTION-CONTROLLING LAYER

This is a continuation of copending application Ser. No. 07/203,633 filed on Jun. 6, 1988, now abandoned.

BACKGROUND OF THE INVENTION

The present invention relates to a method for recrystallizing conductive material films including semiconductors, particularly to a process for an SOI (Silicon on Insulator) technology.

SOI technology is proposed as means for providing high-speed and high-voltage semiconductor integrated circuits (ICs) and is expected as one of the most promissing means for materializing three-dimensional semiconductor integrated circuits. In SOI technology, a polysilicon film is usually formed on an insulating layer such as a thermally-oxidized layer of a silicon substrate and is recrystallized to be single crystalline or grain-boundary free by using irradiation of a radiant energy beam such as a laser. To facilitate the transformation of the polysilicon film into a single crystal film, the nucleation in the polysilicon film during the recrystallization must be controlled to initiate at a single point in the molten region of the polysilicon film. Such condition can be achieved by producing a temperature distribution in the region, which has a profile that is lowest at the center of the region and becoming higher and higher toward the periphery of the region.

There are many reports disclosing methods to establish such temperature profile, including "Recrystallization of Si on amorphous substrate by doughnut-shaped cw Ar laser beam" by S. Kawamura et al., Applied Physics Letter 40 (5), p. 394, 1 March 1982. The doughnut-shaped laser beam, for example, produces a temperature profile the lowest at the position corresponding to the center of the beam. In the United States patent application, Ser. No. 784,607, the present inventor discloses a selective recrystallization of a polysilicon film, using an anti-reflective film having apertures formed therein at the positions corresponding to the regions to be single-crystalline in the polysilicon film. With the apertures, the anti-reflective film produces a desired temperature profile which is the lowest at the center of each region corresponding to the apertures. According to this method, any desired portion of a polysilicon film can be transformed into a single crystalline region of a desired size. These disclosures are categorized as a direct-heating-type SOI technology.

In the United States Pat. No. 4,543,133, published Sep. 24, 1985, and a report entitled as "Single crystalline Si islands on an amorphous insulating layer recrystallized by an indirect laser heating technique for three-dimensional integrated circuits" on pp. 994–996 of Applied Physics Letter 44 (10), 15 May 1984, the present inventor also discloses an SOI technology utilizing an indirect heating of a polysilicon film. In the disclosure, islands of a polysilicon film and the surrounding substrate region are coated with an energy-absorbing cap layer. The energy-absorbing cap layer is irradiated with a radiant energy beam such as an argon ion laser and generates heat. Thus, the polysilicon film islands are melted by the heat transferred from the energy-absorbing cap layer by the thermal conduction.

In such indirect heating SOI technology, the fluctuations in the output power and the intensity distribution of the laser beam are buffered by the energy-absorbing cap layer, and hence, stable and uniform heating can be attained. As a result, the polysilicon islands can be recrystallized to be grain-boundary-free with an improved reproducibility. Further, the indirect heating SOI technology allows the radiant energy beam to be free from the optical absorption characteristics of the to-be-recrystallized film such as polysilicon film and only requires the matching between the wave length of the radiant energy beam such as laser beam and the absorption spectrum of the energy-absorbing cap layer.

However, in the above-mentioned indirect heating SOI technology, the polysilicon film formed on an insulating layer is patterned to provide the islands thereof prior to the recrystallization. The size of each island must be large enough to include therein the source and drain regions together with the active region, i.e. channel region, of a transistor.

Generally, it is difficult to establish the above-mentioned desired temperature profile in the island as the size of the island becomes large. This means that, in the prior art indirect-heating SOI technology, there exist islands each being recrystallized to have a grain boundary with a relatively high probability. If there is an island having a grain boundary extending to the active region thereof in a number of islands on a semiconductor chip, the chip can not any longer be used for an integrated circuit, and thus, the yield of integrated circuit chips based on the indirect-heating SOI technology is decreased.

As described above, it is advantageous that a region to be recrystallized is as small as possible when a desired temperature profile is established therein. Accordingly, it is desired to selectively recrystallize only a small region such as the channel region of a transistor, and the source and drain regions are left in polycrystalline state. However, the prior art indirect-heating SOI technology is unable to selectively recrystallize only such a small region as the channel region in a polycrystalline island.

SUMMARY OF THE INVENTION

It is, therefore, an object of the present invention to provide a method for selectively transforming regions of a polycrystalline film of a conductive material into grain-boundary-free regions in the indirect-heating SOI environment.

It is another object of the present invention to provide a process which can improve the yield of integrated circuit devices fabricated based on SOI.

The above objects can be attained by a process in accordance with the present invention comprising steps of: forming a nonmonocrystalline film of a conductive material including semiconductors such as polysilicon on an insulator; forming a thermal-conduction-controlling layer of silicon dioxide, for example, on the nonmonocrystalline film, the thermal-conduction-controlling layer having thickness selectively increased at each portion thereof corresponding to predefined regions of the nonmonocrystalline film; forming an energy-absorbing cap layer of polysilicon, for example, on the thermal-conduction-controlling layer; and irradiating the energy-absorbing cap layer with an energy beam of radiant energy sufficient to melt and transform the nonmonocrystalline film in the predefined regions to be grain-boundary free by the heat generated in the energy-absorbing cap layer.

BRIEF DESCRIPTION OF DRAWINGS

Further objects, features and advantages of the present invention will become apparent in the reading of description of the preferred embodiment and claims with reference to accompanying drawings, in which;

DESCRIPTION OF PREFERRED EMBODIMENTS

Figure 1:
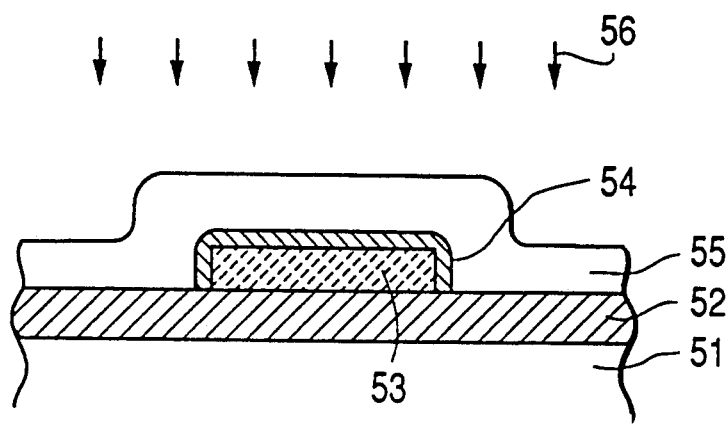
FIG. 1 is a sectional elevation illustrating a recrystallization method according to the prior art indirect-heating SOI.

FIG. 1 is a sectional elevation illustrating a recrystallization method according to the prior art indirect-heating SOI. In the prior art SOI technology, an insulating film 52 is formed on a silicon substrate 51 and a polysilicon island 53 having a size corresponding to a semiconductor element such as a transistor to be fabricated therein is formed on the insulating film 52 through conventional vapor-phase growth and patterning techniques. A separating layer 54 is formed to cover the polysilicon island 53 and then a laser-absorbing layer 55 of polysilicon, for example, is formed on the insulating film 52 having thereon the polysilicon island 53 by using a vapor-phase growth technique. The separating layer 54 is for preventing the fusion of the polysilicon island 53 and laser-absorbing layer 55.

The laser-absorbing layer 55 is irradiated with radiant energy beam 56 such as argon (Ar) ion laser beam having an emission spectra almost equal to the absorption spectra of polysilicon constituting the laser-absorption layer 55. Thus, heat is generated in the laser-absorbing layer 55 and the polysilicon island 53 is heated up above its melting point by the heat transferred from the laser-absorbing layer 55 by thermal conduction. When the laser beam irradiation 56 is removed, the polysilicon island 53 recrystallizes. However, grain boundaries sometimes occur in a few ones of many thousands islands, for example, formed on an integrated circuit chip, because each of islands such as the island 53 has a size as large as 20×60 square-microns so as to contain regions for the source and drain of a transistor, and hence, the temperature distribution formed therein is apt to deviate from a desired profile, as mentioned before.

Figure 2:
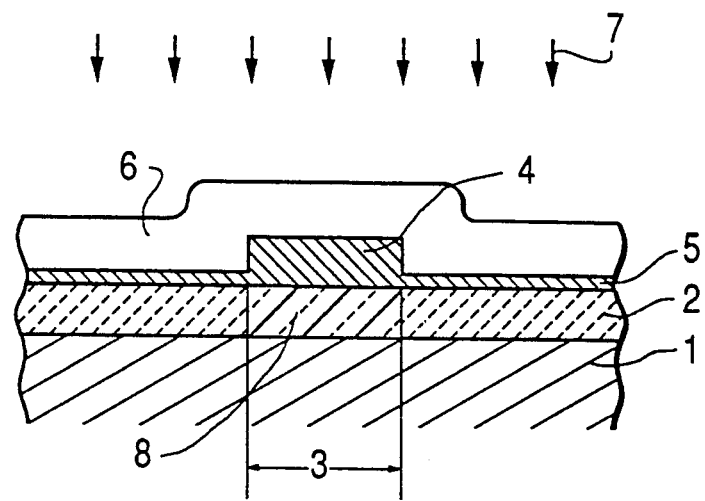
FIG. 2 is a sectional elevation illustrating the principle of the present invention.

FIG. 2 is a sectional elevation illustrating the principle of the present invention. Referring to FIG. 2, in the present invention indirect-heating SOI technology, a conductive material film 2, a semiconductor film, for example, is formed on an insulating film 1, and then, a thermal-conduction-controlling layer (simply referred to as TCC layer, hereinafter) 5 is formed on the conductive material film 2. The TCC layer 5 has a selectively-increased-thickness portion 4 corresponding to the region 3 in which the portion 8 of the conductive material film 2 is transformed to be grain-boundary free. Then, the same as in the prior art indirect-heating SOI, an energy-absorbing cap layer 6 is formed on the TCC layer 5 and irradiation of a radiant energy beam 7 is applied to the energy-absorbing cap layer 6. Thus, the conductive material film 2 is melted by the heat transferred from the energy-absorbing layer 6 and recrystallized.

In the present invention indirect-heating SOI, the TCC layer 5 is usually composed of a material having a thermal conductivity relatively smaller than that of the energy-absorbing cap layer 6, and further, that of the conductive material layer 2. Therefore, the heat flowing from the energy-absorbing cap layer 6 to the conductive material film 2 is restricted by the TCC layer 5, particularly in the region 3. Thus, the temperature of the conductive material film 2 is lower in the region 3 than in the surrounding region thereof. However, there is heat flow directing to the region 3 from the surrounding region, because of the temperature difference caused as described above. Hence, in the region 3, established is such a temperature distribution as being the lowest at the center of the region and becoming higher and higher toward the periphery of the region.

During the recrystallization process of the conductive material film 2, nucleation initiates only at the lowest temperature point in the region 3, and thus, the region 3 is transformed into a grain-boundary-free single-crystal-line region. It is obvious from the above description that there is substantially no lower limit of the size of the region 3. Therefore, the region can be designed as small as the channel region of a transistor. This means that the probability of existence of a grain boundary in the recrystallized region 3 can substantially be decreased compared with that in the recrystallized island 53 of FIG. 1 in accordance with the above mentioned prior art indirect-heating SOI.

FIGS. 3A–3G are sectional elevations illustrating the steps of the present invention indirect-heating SOI technology, wherein like reference numerals designate like or corresponding parts throughout.

Figure 3A:
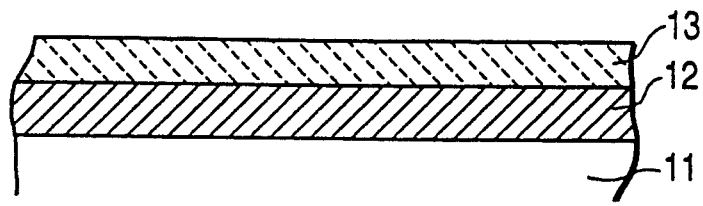
FIGS. 3A–3G are sectional elevations illustrating the steps of the present invention indirect-heating SOI.

Referring to FIG. 3A, a relatively thick lower insulating film 12 such as a silicon dioxide (SiO$_2$) film of 1-2 microns in thickness is formed on a silicon substrate 11 by thermally oxidizing the substrate, for example. Then, a polysilicon film 13 having a thickness of about 4000Å is formed on the lower insulating film 12 by using a conventional low-pressure chemical vapor deposition (LP-CVD), for example.

Figure 3B:
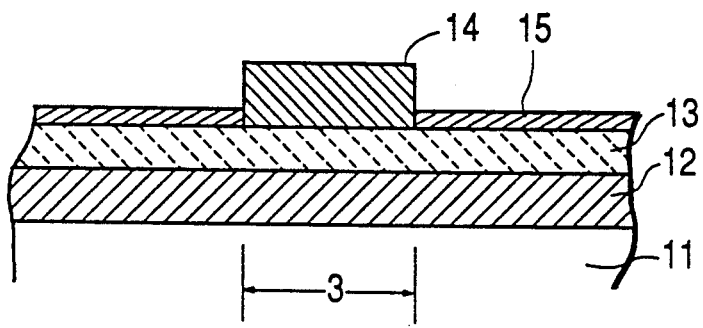

Subsequently, another silicon dioxide (SiO$_2$) layer having a thickness of about 4000Å is formed on the polysilicon film 13 by using a conventional CVD method. The SiO$_2$ layer is patterned by a conventional reactive ion etching technique using a not-shown resist mask and etchant, CHF$_3$ gas, for example. Thus, a SiO$_2$ layer pattern 14 is selectively formed to cover the polysilicon film 13 in the region 3 in which the polysilicon film 13 is transformed to be grain-boundary free. The region 3 is defined as the active region, i.e. channel region, of a transistor and has area as small as 20×20 square-microns. The exposed surface of the polysilicon film 13 around the SiO$_2$ layer pattern 14 is thermally oxidized so as to form another SiO$_2$ layer 15 of 300Å thickness, for example, as shown in FIG. 3B.

Figure 3C:
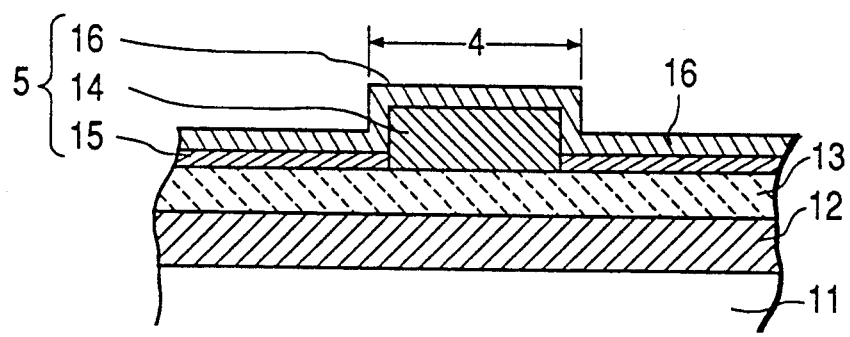

Referring to FIG. 3C, a silicon nitride (Si$_3$N$_4$) layer 16 having a thickness of 800Å, is formed on the SiO$_2$ layer pattern 14 and the SiO$_2$ layer 15 by using a conventional CVD technique. The SiO$_2$ layer 15 has a role to prevent the chemical reaction between the polysilicon film 13 and the Si$_3$N$_4$ layer 16 at a high temperature, and the Si$_3$N$_4$ layer 16 a role to promote the wetting of a laser absorbing layer of polysilicon, which is formed thereon later, to the substrate.

Figure 3D:
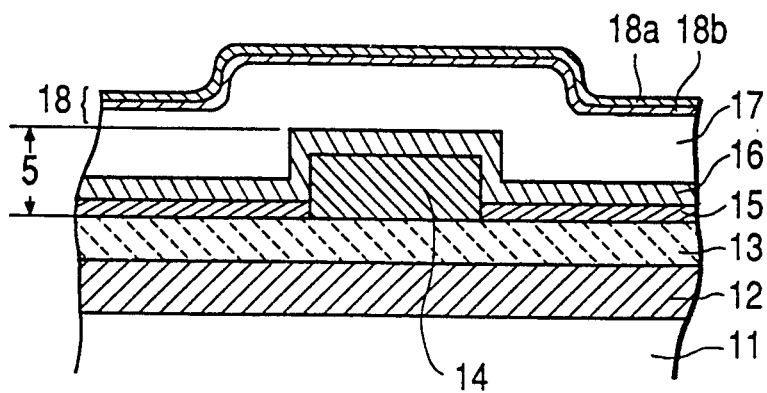

The SiO$_2$ pattern layer 14, SiO$_2$ layer 15 and Si layer 16 in all constitute a thermal-conduction-controlling layer 5, and the selectively-increased-thickness region 4 of the TCC layer 5 corresponds to the predefined region 3 in which the polysilicon film 13 is transformed to be grain-boundary free. Following the above, an energy-absorbing layer 17 of polysilicon, for example, of about 7000Å in thickness is formed on the substrate having the TCC layer 5 by using a conventional LP-CVD technique. Further, as an anti-reflective film 18 for a laser beam, a $Si_3N_4$ film 18a and a $SiO_2$ film 18b, each having thickness of about 300Å, are successively formed on the polysilicon energy-absorbing layer 17, as shown in FIG. 3D.

Figure 3E:
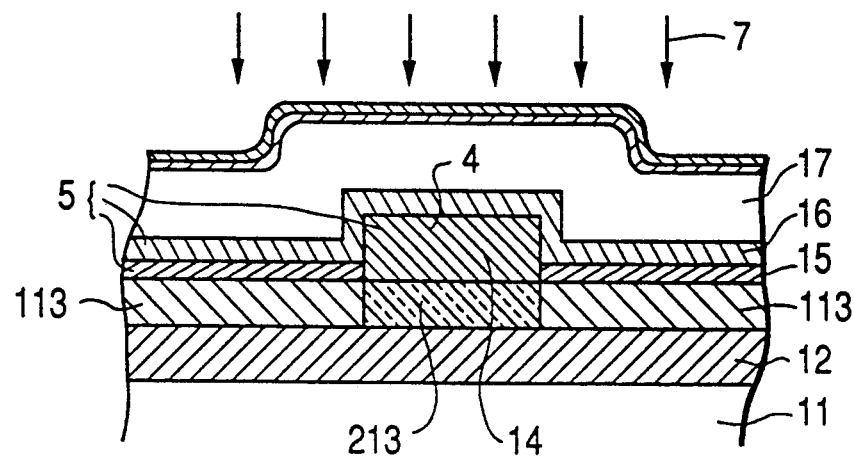

Referring to FIG. 3E, a radiant energy beam 7 is scanned over the polysilicon energy-absorbing layer 17 with a preliminary heating applied to the substrate, and thus, the energy-absorbing layer 17 is heated up to a high temperature of about 1500°-1600° C. An Ar-ion laser which outputs a beam of 500 nanometer in wavelength, for example, is desirably used as the source of the radiant energy beam 7, since silicon reveals strong absorption at the wave length. The laser beam is tuned so as to provide a Gaussian type intensity distribution in the spot of the irradiation thereof. Further, the size of the spot must be large enough to encompass the predefined region of the polysilicon film 13 so that the polysilicon film 13 in the predefined region (20×20 square-microns) is melted by a single scan of the laser beam 7. Exemplary conditions for the laser beam irradiation are summarized as follows:

| Beam spot size: | 100 microns in diameter |
| Intensity of beam: | 13-15 Watts |
| Scanning speed: | 2.5 cm/sec |
| Substrate temperature: | 450° C. |

With the laser beam irradiation under the above conditions, for example, the polysilicon film 13 is melted by the heat transferred from the energy-absorbing layer 17 by the conduction via the TCC layer 5. During the laser beam irradiation, the energy-absorbing layer 17 of polysilicon is also melted. In the predefined region, the heat flowing into the polysilicon film 13 under the $SiO_2$ layer pattern 14, i.e. the large-thickness portion 4, of the TCC layer 5 is less at the central portion compared with that at the peripheral portion, as mentioned before. Thus, established in the polysilicon film 13 in the region is a temperature distribution having a profile the lowest at the center and becoming higher toward the periphery. Accordingly, the recrystallization of the polysilicon film 13 proceeds to spread from the lowest temperature central portion to the peripheral portion, and thus, a grain-boundary-free region 213 is formed in the recrystallized silicon film 113.

The microscopic observation reveals that grain boundaries existing in the recrystallized silicon film 113 extend shunning the region 213 or being stopped at the border of the region 213, and none of grain boundary is found in any predefined regions 213.

Figure 3F:
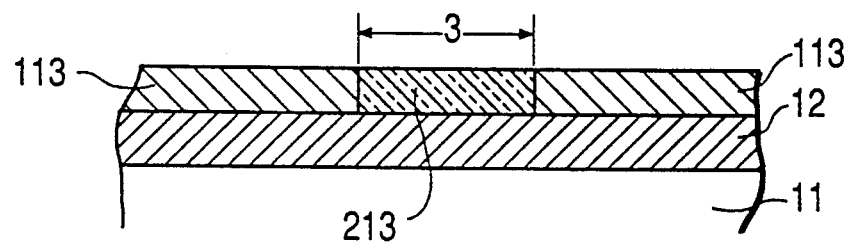

Following the above, the $Si_3N_4$ film 18a and $SiO_2$ film 18b, both constituting an anti-reflective layer are removed by using respective conventional etchants; a phosphoric-acid-type solution for the $Si_3N_4$ film 18a and a fluoric-acid-type acid-type solution for the $SiO_2$ film 18b, for example. Subsequently, the polysilicon energy-absorbing layer 17 is removed by using a conventional etchant such as a mixture of fluoric acid and nitric acid solutions, and then, the $Si_3N_4$ layer 16 and $SiO_2$ layers 15 and 14 are removed by using respective conventional etchants; a phosphoric acid solution for the $Si_3N_4$ layer 16 and a fluoric acid solution for the $SiO_2$ layers 15 and 14. Thus, the TCC layer 5 is removed and the recrystallized silicon film 113 including the predefined region 213 which has been selectively transformed to be grain-boundary-free is exposed as shown in FIG. 3F.

Figure 3G:
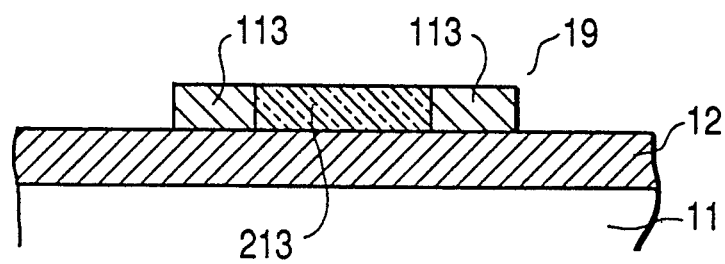

Referring to FIG. 3G, the recrystallized silicon film 113 is patterned by a conventional RIE (reactive ion etching) technique incorporating a not-shown resist mask and an etchant such as a gas mixture of $CF_4+O_2$, for example, and an island 19 of the recrystallized silicon film 113 including the grain-boundary-free region 213 is formed on the $SiO_2$ lower insulating layer 12. Thus, an SOI substrate having a desired number of silicon islands each including a grain-boundary-free region such as the region 213 is completed.

Following the above, a semiconductor circuit element such as transistor is formed in the silicon island 19, wherein the active region such as the channel region of a transistor is allocated in the grain-boundary-free region 213 and the source and drain regions of the transistor are fabricated in the recrystallized silicon region 113 around the grain-boundary-free region 213. Thus, a integrated circuit having an SOI structure is provided according to the present invention.

According to the present invention, the recrystallized silicon island 19 has the same size of 20×60 square-microns, for example, as that of the prior art silicon island 53 shown in FIG. 1, however, only a smaller region such as the active region of a transistor formed in the island is selectively transformed to be grain-boundary free. Therefore, the probability of existence of a grain boundary in the active region is substantially decreased, and hence, the yield of SOI ICs can be increased. Further, in the present invention indirect-heating SOI technology, the shape of island can not only be simple as being rectangular but be complicated as the structure of letters C, E, H and so forth, wherein a desired number of active regions can be formed in the structure.

The above embodiment describes an SOI structure for a semiconductor integrated circuit, however, the recrystallization method of the present invention can be applied to the metallized layer of an integrated circuit. That is, a wiring layer such as formed from amorphous aluminum, fabricated by a vacuum deposition or sputtering technique, for example, is selectively transformed into a grain-boundary-free aluminum layer. Such grain-boundary-free wiring layer can eliminate a type of disconnection which occurs in the wiring lines for large current load due to the grain boundaries existing therein.

While the present invention has been described in its preferred embodiment, it is to be understood that modifications will occur to those skilled in the art without departing from the spirit of the invention, for example, the $SiO_2$ film 15 and $Si_3N_4$ film 16 and the anti-reflective layer 18 shown in FIG. 3D are not essential to the present invention. Further, the energy-absorbing layer 17 in FIG.3D, for example, is not restricted to polysilicon but may be replaced by a layer of other materials, provided matching of the wavelengths is established between the emission of the laser beam and the absorption spectra of the energy-absorbing layer, wherein the other materials may have a higher melting point than that of the film to be recrystallized.

I claim:

1. A process for forming a gain-boundary free recrystallized region at portions of a polycrystalline semiconductor layer formed on an insulator using indirect-heating, comprising the steps of:

a) forming a polycrystalline semiconductor layer on an insulator;

b) forming a thermal-conduction-controlling layer, on the polycrystalline semiconductor layer, the thermal-conduction controlling layer including:
   i) a first portion of silicon oxide which is a patterned silicon oxide layer formed on a portion of the polycrystalline semiconductor layer;
   ii) a second portion of silicon oxide which is a silicon oxide layer formed on the polycrystalline semiconductor layer, surrounding the first portion and being thinner than the first portion; and
   iii) a silicon nitride layer formed over the first and second portions of the silicon oxide layer;

c) forming an energy-absorbing layer on the thermal-conduction-controlling layer; and d) irradiating the energy-absorbing layer with an energy beam of radiant energy sufficient to melt the polycrystalline semiconductor layer by thermal conduction from the energy-absorbing layer and transforming the polycrystalline semiconductor layer directly underneath the first portion of the thermal-conduction-controlling layer into a grain-boundary free recrystallized region while maintaining the polycrystalline semiconductor directly underneath the second portion of silicon oxide as a polycrystalline region having grain boundaries.

2. A process according to claim 1, wherein said thermal-conduction-controlling layer and energy-absorbing layer have respective thermal conductivities, and wherein the thermal conductivity of the thermal conduction-controlling layer is smaller than the thermal conductivity of the energy-absorbing layer.

3. A process according to claim 1, further comprising a step of forming an anti-reflective layer on the energy-absorbing layer, the anti-reflective layer reducing reflection of the radiant energy beam from the surface of the energy-absorbing layer.

4. A process according to claim 1, wherein the energy beam is an argon ion laser beam.

5. A process according to claim 1, wherein the energy-absorbing layer comprises polycrystalline silicon.

* * * * *

UNITED STATES PATENT AND TRADEMARK OFFICE
CERTIFICATE OF CORRECTION

PATENT NO. : 5,264,072
DATED : NOVEMBER 23, 1993
INVENTOR(S) : RYOICHI MUKAI

It is certified that error appears in the above-identified patent and that said Letters Patent is hereby corrected as shown below:

Col. 1, line 10, "abandoned." should be --abandoned, which is a continuation of application Ser. No. 06/937,412 filed on Dec. 3, 1986, abandoned.--;

line 40, "the" (first occurrence) should be --which is--.

Col. 2, line 55, "semiconductors" should be --semiconductors,--; and "polysilicon" should be --polysilicon,--.

Col. 4, line 64, "Si" should be --$Si_3N_4$--.

Col. 8, line 4, "semiconductor directly" should be --semiconductor layer directly--.

Signed and Sealed this

Nineteenth Day of July, 1994

Attest:

BRUCE LEHMAN

Attesting Officer    Commissioner of Patents and Trademarks